US006525802B1

United States Patent
Novak

(12) United States Patent
(10) Patent No.: US 6,525,802 B1
(45) Date of Patent: Feb. 25, 2003

(54) KINEMATIC MOUNTED REFERENCE MIRROR WITH PROVISION FOR STABLE MOUNTING OF ALIGNMENT OPTICS

(75) Inventor: W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/435,155

(22) Filed: Nov. 5, 1999

(51) Int. Cl.[7] .................. G03B 27/42; G03B 27/52; G03B 7/02
(52) U.S. Cl. ................... 355/53; 355/55; 359/820
(58) Field of Search .................. 355/53, 55; 359/819, 359/820, 204; 356/399, 400, 401

(56) References Cited

U.S. PATENT DOCUMENTS

| | | | |
|---|---|---|---|
| 3,722,996 A | 3/1973 | Fox | |
| 4,190,325 A | * 2/1980 | Moreno | 359/820 |
| 4,676,630 A | 6/1987 | Matsushita et al. | |
| 4,733,945 A | 3/1988 | Bacich | |
| 4,780,617 A | 10/1988 | Umatate et al. | |
| 4,782,475 A | 11/1988 | Chandler | |
| 4,952,858 A | 8/1990 | Galburt | 318/647 |
| 4,961,115 A | 10/1990 | Jessop | |
| 4,962,318 A | 10/1990 | Nishi | |
| 5,153,678 A | 10/1992 | Ota | |
| 5,187,519 A | 2/1993 | Takabayashi et al. | |
| 5,270,870 A | 12/1993 | O'Brien et al. | |
| 5,325,180 A | 6/1994 | Chappelow et al. | |
| 5,440,397 A | 8/1995 | Ono et al. | |
| 5,493,403 A | 2/1996 | Nishi | |
| 5,508,518 A | 4/1996 | Kendall | 250/492.2 |
| 5,563,708 A | 10/1996 | Nakai | |
| 5,576,895 A | 11/1996 | Ikeda | |
| 5,581,324 A | 12/1996 | Miyai et al. | |
| 5,623,853 A | 4/1997 | Novak et al. | 74/490.09 |
| 5,675,413 A | 10/1997 | Prikryl et al. | |
| 5,715,078 A | * 2/1998 | Shiraishi | 347/244 |
| 5,760,564 A | 6/1998 | Novak | 318/687 |
| 5,798,530 A | 8/1998 | Okumura | |
| 5,900,105 A | 5/1999 | Toshima | 156/345 |
| 5,909,030 A | 6/1999 | Yoshitake et al. | 250/492.2 |
| 5,953,106 A | * 9/1999 | Unno et al. | 355/55 |
| 5,959,427 A | 9/1999 | Watson | 318/687 |
| 5,996,437 A | 12/1999 | Novak et al. | 74/490.09 |
| 6,208,407 B1 | * 3/2001 | Loopstra | 355/53 |

OTHER PUBLICATIONS

U.S. patent application, Ser. No.: 09/952,444, "A Low Distortion Kinematic Reticle Support" Novak–Inv. Sep. 13, 2001–Filing Date.

* cited by examiner

Primary Examiner—Russell Adams
Assistant Examiner—Peter B. Kim
(74) Attorney, Agent, or Firm—Finnegan, Henderson, Farabow, Garrett & Dunner, L.L.P.

(57) ABSTRACT

The invention provides a reference assembly that is mounted coaxially with an axis of a projection unit used in lithographic equipment to form semiconductor devices and LCDs. The reference assembly is made of a material having a low coefficient of thermal expansion, and the reference assembly has one or more reference features such as a mirror or off-axis alignment system that represent the axis of the projection unit. The reference assembly is attached to a housing of the projection unit by expansion joints such as flexures, which absorb the thermal expansion and contraction of the housing without significantly affecting the relationship of the reference features to the axis of the projection unit. The invention also provides a projection unit incorporating a reference assembly as well as a method of providing reference features and a method of making a semiconductor device.

10 Claims, 5 Drawing Sheets

KINEMATIC MOUNTED REFERENCE MIRROR WITH PROVISION FOR STABLE MOUNTING OF ALIGNMENT OPTICS

The invention relates to an alignment or positioning system for image-forming equipment used in manufacturing semiconductor devices and liquid crystal displays (LCD).

BACKGROUND AND PROBLEMS ADDRESSED BY THE INVENTION

This background is provided to establish the context of the invention and is not to be interpreted as an admission that features and/or problems discussed herein were known or recognized by one of ordinary skill in the art at the time of the invention.

Many devices such as semiconductor circuits and liquid crystal displays are formed using lithographic equipment. It is necessary to repeatedly position a substrate beneath the optics of the lithographic equipment very precisely in order to accurately align each microscopic feature being formed in a new layer with other features previously formed individually in the multiple layers forming the semiconductor circuits or liquid crystal displays.

Complex alignment and positioning systems have been developed to precisely position the substrate beneath the lithographic optics. Conventional alignment systems can generally be classified into three categories: an off-axis alignment system for performing alignment without the mediacy of a projection unit, a throughthe-lens ("TTL") alignment system designed to detect an alignment mark on a wafer through a projection unit without detecting any alignment mark on a reticle, and a through-the-reticle ("TTR") alignment system for performing alignment through a projection unit that uses a mark on a reticle to align the wafer.

An off-axis alignment system is designed to detect an alignment mark on a wafer through an objective lens. The optics of the off-axis alignment system are separated from the projection unit by a predetermined distance.

A TTL alignment system is designed to detect an alignment mark on a wafer through the projection optics without detecting any alignment mark on a reticle. In lithographic equipment having a TTL or off-axis alignment system, the position of an alignment mark formed beforehand near each shot area on a photosensitive substrate in the previous step is detected by using both the off-axis or TTL alignment system, which detects no alignment mark on a reticle, and a stage position detection means such as a laser interferometer. In addition, a baseline amount which is the distance between the detection center of the alignment system and the optical axis of the projection unit is obtained in advance. The photosensitive substrate is sequentially aligned with the positions obtained by correcting the detected positions by the baseline amount, thereby effecting exposure on each shot area on the photosensitive substrate.

In lithographic equipment having a TTR alignment system, the position of a stage at which exposure is to be effected is not obtained, but alignment of a reticle and a photosensitive substrate is performed by simultaneously observing a mark on the photosensitive substrate and a mark on the reticle, thereby effecting exposure.

The above-mentioned TTR, TTL, and off-axis alignment systems are described in more detail in, e.g., U.S. Pat. Nos. 4,962,318 and 5,798,530, each of which is incorporated by reference in its entirety for all that it teaches.

The substrate, the substrate positioning stage, and the lithographic equipment each have features that are used to indicate the position of the substrate positioning stage in relation to the lithographic equipment. In one example of an off-axis alignment system, reference mirrors are placed on the substrate positioning stage and on the outside of the housing of the lithographic equipment by, for example, mounting them on INVAR® metal inserts in a brass ring plate attached to the bottom of the projection unit. Beams of laser light are reflected off the reference mirrors and are detected by sensors, and the position of the substrate positioning stage relative to the lithographic equipment is determined from the detected light. Motors on the substrate positioning stage move the stage until the wafer is properly positioned beneath the lithographic equipment.

There are many factors that inhibit the precise placement of the substrate, and thermal variations are one major source of inaccuracy in precise placement of the substrate. The light or charged particle beams produce heat as they are partially absorbed by the optics used to focus the beams onto the substrate. When a substrate is first positioned onto the substrate positioning stage, no energy has been absorbed by the optics since the beam is shut off. However, as the beam is rapidly turned on and off as the substrate is alternately exposed to the beam and repositioned by motors on the substrate positioning stage, the optics heat and cool, and the housing in which the optics are positioned expands and contracts. The lithographic equipment usually contains a sophisticated heat exchange system that maintains the temperature of the atmosphere surrounding the equipment essentially constant (within approximately ±0.05 degrees C. of set-point) and maintains the temperature of the projection unit itself essentially constant (within approximately 0.01 degrees C. of set-point), but the rate at which heat is added to the equipment changes sufficiently rapidly that the temperature of the housing in which the optics are contained fluctuates despite the temperatures of the atmosphere around the housing and the projection unit itself being held essentially constant.

Reference points that are mounted to the housing of the lithographic equipment move as the housing expands and contracts due to thermal expansion and contraction. Consequently, features external to the housing that are used as reference points for the axis of the lithographic equipment move relative to the axis. This movement of the reference points may introduce an inaccuracy into the positioning system, since the reference points do not maintain a fixed relationship to the axis of the lithographic equipment.

One system for compensating for movement of a reference feature is an off-axis objective, which determines the position of alignment markers on wafers and other substrates being processed to provide correct alignment of the substrate with the projection unit. The off-axis objective uses interferometers and mirrors attached to the objective to provide a signal representative of the amount of movement of the off-axis objective. Any movement is monitored periodically to detect and correct for changes in the location of the off-axis objective. A system that reduces or possibly eliminates this movement and the need to measure this movement would help to provide more accurate alignment of the substrate to the projection unit as well as a less-complicated and faster system.

There is consequently a need for equipment and methods that maintain a constant distance between the axis of the lithographic equipment and features that are external to the lithographic equipment and that act as reference points for the axis of the lithographic equipment. There is also a need for equipment that can provide better alignment of features formed using multiple layers and multiple lithographic steps.

SUMMARY OF THE INVENTION

It is one object of the invention to provide a reference assembly that mounts coaxially to a piece of equipment and provides a reference feature that is positioned a known and consistent distance from the axis of the piece of equipment, regardless of temperature fluctuations of the equipment.

It is another object of the invention to provide a method of positioning a target substrate beneath projection optics of lithographic equipment that utilizes a reference feature that is in an essentially fixed position to the equipment.

The invention in one embodiment provides a reference assembly that is mounted coaxially with an axis of a projection unit, wherein the reference assembly has a structure formed of a material having a low coefficient of thermal expansion, the structure has one or more reference features thereon, and the structure is mounted to a housing of the projection unit using expansion joints that compensate for the thermal expansion and contraction of the housing for the projection unit. A reference feature maintains at least a substantially fixed relationship to the axis of the projection unit as the system heats and cools during use. The invention also provides an exposure apparatus that incorporates the reference assembly with other equipment such as a substrate positioning stage and a projection unit.

The invention in another embodiment provides a method for positioning a target substrate beneath a projection optics system. The method utilizes a reference assembly of the invention to accurately establish the position of a substrate positioning stage carrying the target substrate after the position of the substrate is established by observing reference markers on the target substrate and after the position of the reference markers are correlated to the position of the substrate positioning stage at the time the reference markers are observed.

Among other factors, the invention is based on the technical finding that a coaxially-mounted reference assembly formed of a material having low coefficient of thermal expansion and attached to the housing of lithographic equipment by expansion joints that compress or expand as the equipment expands or contracts provides the ability to accurately place a substrate beneath the lithographic equipment despite changes in temperature that the equipment experiences. These technical findings and advantages and others are apparent from the discussion herein.

BRIEF DESCRIPTION OF THE FIGURES

FIG. 7(*b*) illustrates a graph showing a waveform of a measurement signal SX that might be obtained and that corresponds to the signal of FIG. 7(*a*).

DETAILED DESCRIPTION OF THE PREFERRED EMBODIMENT

Figure 1:
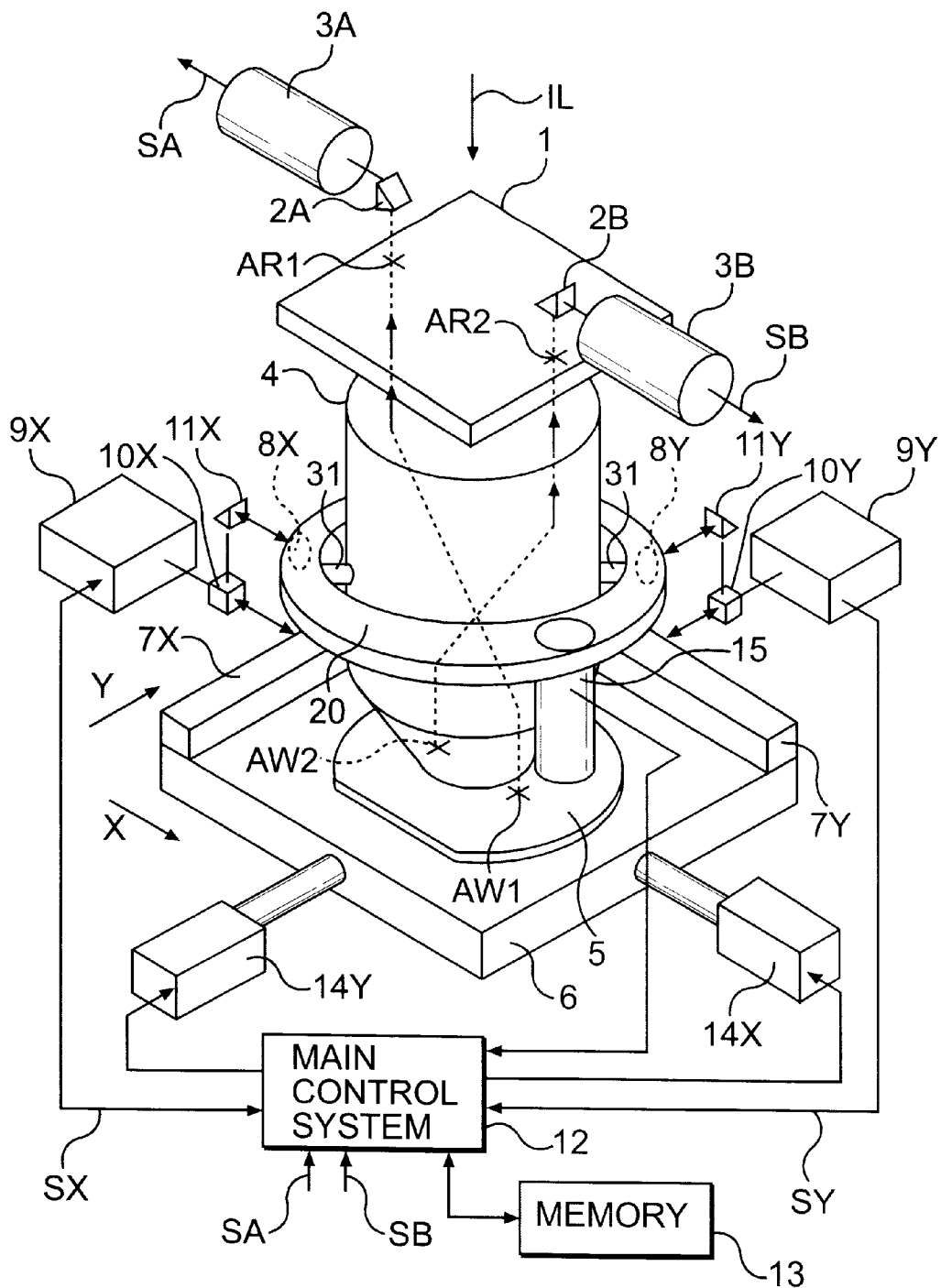
FIG. 1 illustrates lithographic equipment containing a projection unit to reduce an image and focus the beams of the image onto a substrate and a substrate positioning stage for positioning the substrate beneath the beams.

FIG. 1 illustrates lithographic equipment of one embodiment of the invention. In this system, a reticle 1 is placed on a reticle stage (not shown). An orthogonal coordinate system constituted by the X- and Y-axes is set to be parallel to the reticle 1. The reticle 1 has a pair of alignment marks AR1 and AR2 outside the pattern area of the reticle 1 in the X direction. Right-angle prisms 2A and 2B for bending optical paths are arranged above the alignment marks AR1 and AR2, respectively. Alignment systems 3A and 3B are respectively arranged in the directions in which the optical paths are bent by the right-angle prisms 2A and 2B. One alignment system 3A outputs a detection signal SA. The detection signal SA is a detection signal corresponding to the X- and Y-direction positional shift of a mark AW1 on a substrate 5 carried by a wafer stage 6 (to be described later), as measured by the shift in a conjugate image AR1 of the mark formed on the reticle 1. Similarly, the other alignment system 3B outputs a detection signal SB. The detection signal SB is a detection signal corresponding to the X- and Y-direction positional shift of a mark AW2, as measured by the shift in a conjugate image AR2 of the mark formed on the reticle 1.

A projection unit 4 and the wafer stage 6 for holding a wafer 5 are arranged below the reticle 1 in the order named. The wafer stage 6 is fixed to a base for supporting the projection unit 4. The wafer stage 6 is constituted by an X-Y stage for positioning the wafer 5 within a plane perpendicular to the optical axis of the projection unit 4 (i.e., the X-Y plane), a Z stage for positioning the wafer 5 in a direction parallel to the optical axis of the projection unit 4, a leveling stage for leveling the wafer 5, and the like. When the wafer 5 is a wafer to which exposure should be made, the pattern area of the reticle 1 is illuminated with exposure light IL from an illumination optical system with a uniform illumination. The resultant pattern image of the pattern area is projected/exposed on each shot area on the wafer 5 by the projection unit 4.

Alignment marks are formed near the respective shot areas of the wafer 5. FIG. 1 shows a pair of alignment marks AW1 and AW2. The alignment marks AW1 and AW2 are marks to be observed through an off-axis alignment system, as will be described later. The alignment marks AR1 and AR2 of the reticle 1 are positioned such that when one alignment mark AW1 is at a position almost conjugate to one alignment mark AR1, the other alignment mark AW2 is set to be almost conjugate to the other alignment mark AR2.

A movable mirror 7X is disposed on an end portion of the wafer stage 6 in the X direction, while a reference mirror 8X is disposed on a side surface of the reference structure 20 in the X direction. A movable mirror 7Y is disposed on an end portion of the wafer stage 6 in the Y direction, while a reference mirror 8Y is disposed on a side surface of the reference structure 20 in the Y direction. A laser beam from an X-axis laser interferometer 9X is split into the first and second laser beams by a polarizing prism 10X. The first laser beam transmitted through the polarizing prism 10X propagates toward the movable mirror 7X. The second laser beam reflected by the polarizing prism 10X propagates toward the reference mirror 8X through a right-angle prism 11X. The first and second laser beams respectively reflected by the movable mirror 7X and the reference mirror 8X propagate back through the optical paths to be mixed with each other. The laser interferometer 9X supplies a main control system 12 with a measurement signal SX corresponding to the X-direction coordinates of the wafer stage 6 with reference to the reference mirror 8X of the projection unit 4 on the basis of the mixed first and second laser beams.

Similarly, a laser beam from a Y-axis laser interferometer 9Y propagates toward the movable mirror 7Y and the reference mirror 8Y through a polarizing prism 10Y and a right-angle prism 11Y. The laser beams reflected by the movable mirror 7Y and the reference mirror 8Y propagate back through their optical paths to be mixed with each other. The laser interferometer 9Y supplies, to the main control system 12, a measurement signal SY corresponding to the Y-axis coordinates of the wafer stage 6 with reference to the reference mirror 8Y of the projection unit 4.

Figure 2:
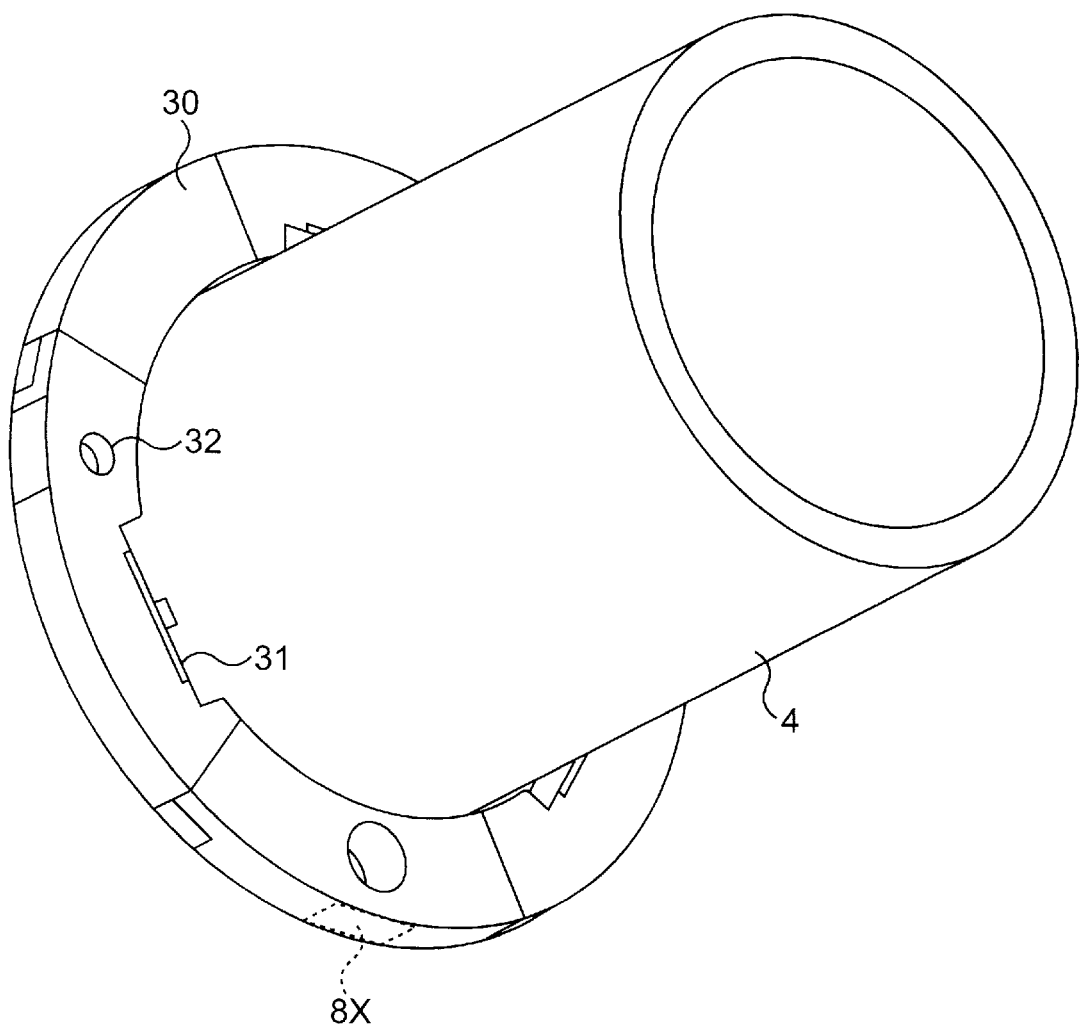
FIG. 2 illustrates more detail of a reference structure of this invention attached to lithographic equipment.

FIG. 2 provides a more detailed view of the reference structure illustrated in FIG. 1. The reference structure illustrated in FIG. 2 is a ring 30 that has a reference feature, mirror 8X, on a face of the ring, and the reference structure has expansion joints 31 used to mount the structure to the housing 4.

The reference structure is formed of a material having a low coefficient of thermal expansion, such as ZERODUR® available from Schott Glas in Mainz, Germany and many distributors in the U.S. ZERODUR® is an inorganic, non-porous glass-ceramic material which has a crystalline phase and a glassy phase. The material generally contains 70–78 weight percent crystalline phase with a high quartz structure. ZERODUR® is manufactured by methods common in glass technology, where suitable raw materials are melted, refined, homogenized, and then hot-formed. After cooling and annealing the glassy blank, the blank is heat-treated to transform it into a glass ceramic through controlled volume crystallization. During this heat treatment, nuclei form within the glass, and the crystals subsequently grow at a somewhat higher temperature. The crystalline phase and the glass phase together provide the material with its low coefficient of thermal expansion, among other properties. In this context, the coefficient of thermal expansion is low when the reference structure's coefficient of thermal expansion is less than the coefficient of thermal expansion of the housing of the projection unit to which the reference structure is attached. In a preferred embodiment of the invention, the reference structure's coefficient of thermal expansion is substantially less than the coefficient for the housing, so that the reference feature remains an essentially constant distance from the axis of the projection optics despite thermal expansion and contraction of the housing. Preferably, the reference structure has a coefficient of thermal expansion less than $10^{-6}$/deg C., and more preferably the coefficient is less than $10^{-7}$/deg C.

The reference structure can be formed as a single unit, or the reference structure can be formed from multiple pieces of the same material or different materials. Multiple pieces can be screwed or bolted together, and multiple pieces may be bonded together using an adhesive. Preferably, all of the pieces and materials used to form the reference structure have a low coefficient of thermal expansion. Suitable materials include ZERODUR® ceramic glass, low expansion ceramics, and INVAR metal. INVAR metal is a Ni-Fe alloy that contains about 31% Ni, 5% Co, and 64% Fe that is available from many suppliers in the U.S.

The reference structure may have holes 32 in it to allow an optical beam to pass unimpeded through the structure to perform focusing or levelling functions or to lighten the structure so that the expansion joints do not have to support more mass than is necessary. The reference structure may have a single reference feature such as a mirror 8X polished into the side of the structure. Or, the reference structure may have multiple reference features, such as two or more mirrors polished into the side of the structure or one mirror plus an off-axis alignment optics unit as described below. Mirrors may be formed of a separate material (such as polished ZERODUR® ceramic glass or INVAR metal) and be bonded to a ring of ZERODUR® ceramic glass using e.g. an epoxy adhesive.

The reference structure is attached to the housing of the projection unit through expansion joints 31. The expansion joints flex or otherwise absorb thermal expansion and contraction of the housing so that the reference ring, which is not expanding at as high of a rate as the housing, remains in essentially the same position without rotating and without moving substantially in the X and Y directions.

The housing of the projection unit is typically made of brass or steel, each of which has a high coefficient of thermal expansion. The housing of the projection unit also preferably has a cross-sectional shape that can be bisected into mirror images, such as a circle, square, rectangle, pentagon, or like shape. This symmetrical cross-sectional shape allows the expansion joints to be placed so that the expansion joints absorb the expansion or contraction of the housing without substantially shifting the reference structure away from its desired static position.

The reference structure has a reference feature that more accurately represents the axis of the projection optics than a reference point that is attached to the side of the housing. Preferably, the reference structure remains an essentially fixed distance from the axis of the projection optics despite thermal expansion and contraction of the housing of the projection unit. In this preferred embodiment, an essentially fixed reference point is established that can be used to measure the distance that equipment such as the substrate positioning stage has moved. The reference feature can consequently be used either as a fixed reference point without reference to another point or as a fixed point that represents the axis of the projection optics within the housing of the projection unit.

The various characteristics of the reference structure cooperate to provide an essentially fixed reference point. The reference structure expands very little, and consequently the reference feature on the reference structure moves very little due to thermal expansion of the reference structure. The expansion joints of the reference structure absorb the movement of the housing caused by thermal expansion and contraction, keeping the reference structure in essentially a constant relationship with the axis of the projection optics. The expansion joints are also preferably positioned so that any differential expansion that the housing experiences does not substantially affect the position of the reference structure or the reference feature. The characteristics together thus absorb movements of the structure to which the reference structure is attached and provide a stable reference point from which distances can be measured. The housing should expand and contract as uniformly as possible. To facilitate uniform expansion, the housing preferably has a symmetrical shape so that the mounting points move radially the same distance from the optical axis. Also, the housing is preferably uniformly heated or cooled, or at least symmetrically heated or cooled, so that its parts expand or contract like amounts at the reference structure's mounting points. But, symmetry is not required, nor does the expansion joint need be mounted a fixed distance from the center of the optical structure. What is preferred is that expansion of the housing does not cause a distortion of the ring or a lateral displacement of the ring.

Figure 3:
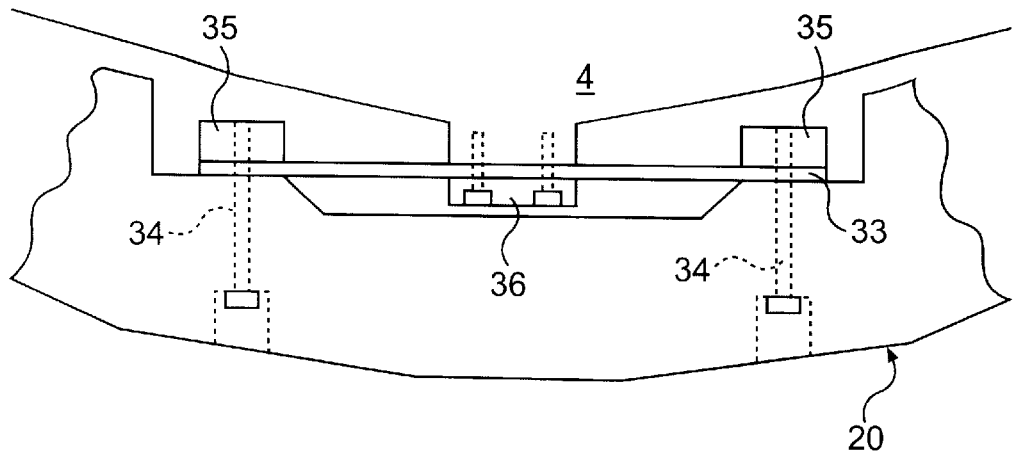
FIG. 3 illustrates a flexure that can be used as an expansion joint of the reference structure of this invention.

One expansion joint that can be used to mount the reference structure 20 to the housing of the projection unit is illustrated in FIG. 3. Here, reference ring 20 is attached to the edges of a thin plate 33 via screws, rivets, bolts 34 and clamping blocks 35, bolts and nuts, or other suitable fasteners, and the thin plate is attached at its center to an ear or clamping block 36 on the housing 4 of the projection unit using similar fasteners. This assembly provides a symmetrical double-flexure wherein the thin plate flexes in one direction as the housing expands and in the opposite direction as the housing contracts. A single flexure whose ends are attached individually to the ring and housing may be used instead of the double flexure illustrated in FIG. 3.

The expansion joints are preferably located on the reference structure so that any differential expansion that the housing experiences does not affect the position of the structure substantially. Expansion joints that are positioned 180 degrees from one another readily absorb differential expansion or contraction, and consequently the reference structure may have an even number of expansion joints (two, four, six, or more). Odd numbers of expansion joints (such as 3, 5, or more) may also be used, and preferably each expansion joint on the reference ring is located an equal angular distance from its adjacent expansion joints. Differential expansion can be minimized by mounting components within the projection unit in a stable and symmetrical manner (as, for example, described above or using other well-known equipment and methods).

A memory 13 is connected to the main control system 12. The memory 13 serves to store the measurement signals SX and SY for a predetermined period. The main control system 12 sets the coordinates of the wafer stage 6 to coordinates determined in accordance with an exposure sequence by step-driving the wafer stage 6 within the X-Y plane through X-axis and Y-axis drivers 14X and 14Y. In addition, the detection signals SA and SB from the TTR alignment systems 3A and 3B are supplied to the main control system 12.

An off-axis alignment system 15 is arranged beside the housing of the projection unit 4. An off-axis alignment system may be fixed on the base on which the projection unit 4 is supported. The positions of alignment marks (e.g., the alignment marks AW1 and AW2) formed near the respective shot areas on the wafer 5 can be detected using an off-axis alignment system. A baseline amount which is the distance between the detection center of the alignment system and the optical axis of the projection unit is obtained in advance by measuring a reference feature on the stage or exposing wafers and measuring the positions of reference features on the wafers.

Figure 4:
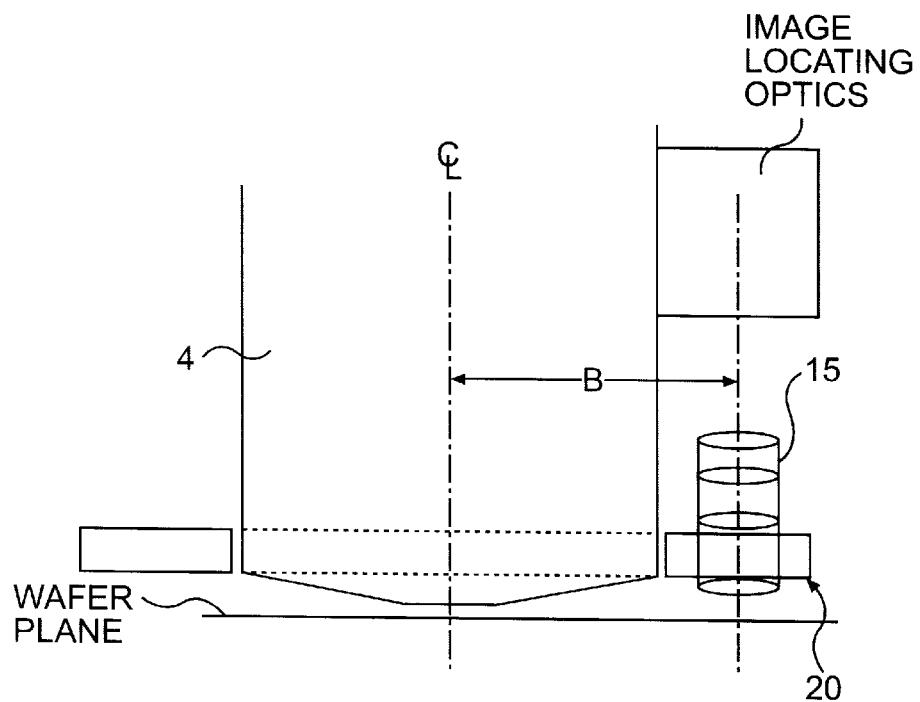
FIG. 4 illustrates a reference feature (e.g. an alignment microscope objective) attached to a reference structure of this invention.

The off-axis alignment system 15 is preferably attached to a reference structure 20 as a reference feature, as illustrated in FIG. 1 and FIG. 4. The off-axis alignment system may be the only reference feature on the structure, or the off-axis alignment system can be one of a number of reference features on the structure. The objective optics of the off-axis alignment system are preferably housed within a housing made of a material having a low coefficient of thermal expansion, such as INVAR®. Because the objective optics are mounted to the reference structure, the optical axis of the objective maintains an essentially constant distance from the axis of the projection unit. The off-axis alignment system consequently determines the position of alignment marks on the wafers or other substrates being processed with greater accuracy than off-axis alignment systems that are attached to materials having a high coefficient of thermal expansion. Image forming and locating optics above the objective may be attached to the side of the projection unit, or may be attached to another reference ring as a reference feature in order to maintain a stable relationship between the optics above the objective and the objective itself.

The lithographic equipment illustrated in FIG. 1 can be operated as described in U.S. Pat. No. 5,798,530 and as summarized in the flow chart of FIG. 5. In steps 101–105 of FIG. 5, a test wafer (as illustrated in FIG. 6) having alignment marks (16-1, 16-2, . . . 16-N) formed at positions substantially in the same positional relationship as marks on a production wafer is used to calibrate the stepper system and place coordinate values for the marks into memory. Light radiates from each of the alignment systems 3A and 3B onto the test wafer through the reticle 1 and the projection unit to form conjugate images of the alignment marks on the reticle 1. The main control system 12 controls the operation of the wafer stage 6 such that the positional shift amounts (in the X and Y directions) of the conjugate images of the two alignment marks on the test wafer with respect to the alignment marks AR1 and AR2 on the reticle 1 become a predetermined value (e.g., 0) (step 104).

Figure 7A:
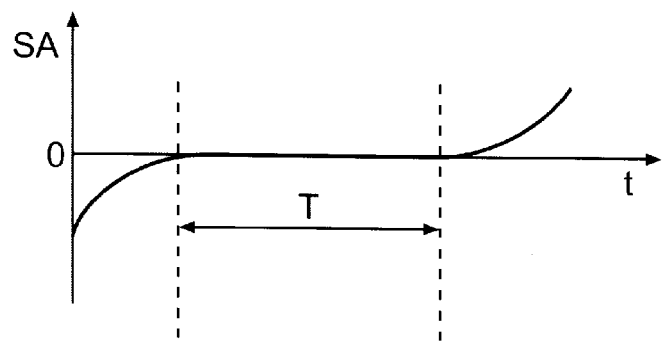
FIG. 7(*a*) illustrates a graph of a waveform of an X-direction detection signal SA in step 104 of FIG. 5 that might be obtained.
Figure 7B:
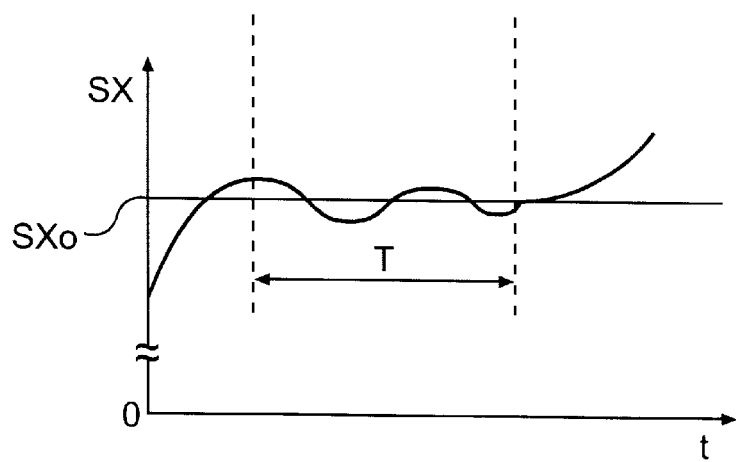

FIG. 7(a) shows a possible X-direction detection signal of the detection signal SA output from the alignment system 3A in FIG. 1 for a predetermined sampling period T when the main control system 12 controls movement of the wafer stage 6 in step 104 such that the positional shift amounts of the conjugate images of the two alignment marks on the test wafer with respect to the alignment marks on the reticle 1 becomes 0. However, in the period during which the X-direction detection signal of the detection signal SA coincides with 0 ("SX0"), as shown in FIG. 7(a), the X-direction measurement signal SX from the X-axis laser interferometer 9X in FIG. 1 does not always coincide with aimed value SX0 but varies near the aimed value SX0, as shown in FIG. 7(b). Vibrations among other factors cause variations in the measurement signal SX shown in FIG. 7(b).

The main control system 12 samples the measurement signal SX in the period T by using a clock signal having a predetermined high frequency, and the memory 13 in FIG. 1 stores the sampled measurement signal SX. In addition, assuming that the Y-direction detection signal of the detection signal SA continues to coincide with a predetermined aimed value during the period T, the measurement signal SY supplied from the laser interferometer 9Y in FIG. 1 during the period T is also stored in the memory 13. It is preferable for the stepping operation to be repeated a number of times with respect to a shot area in order to average the obtained measurement signals SX.

Figure 5:
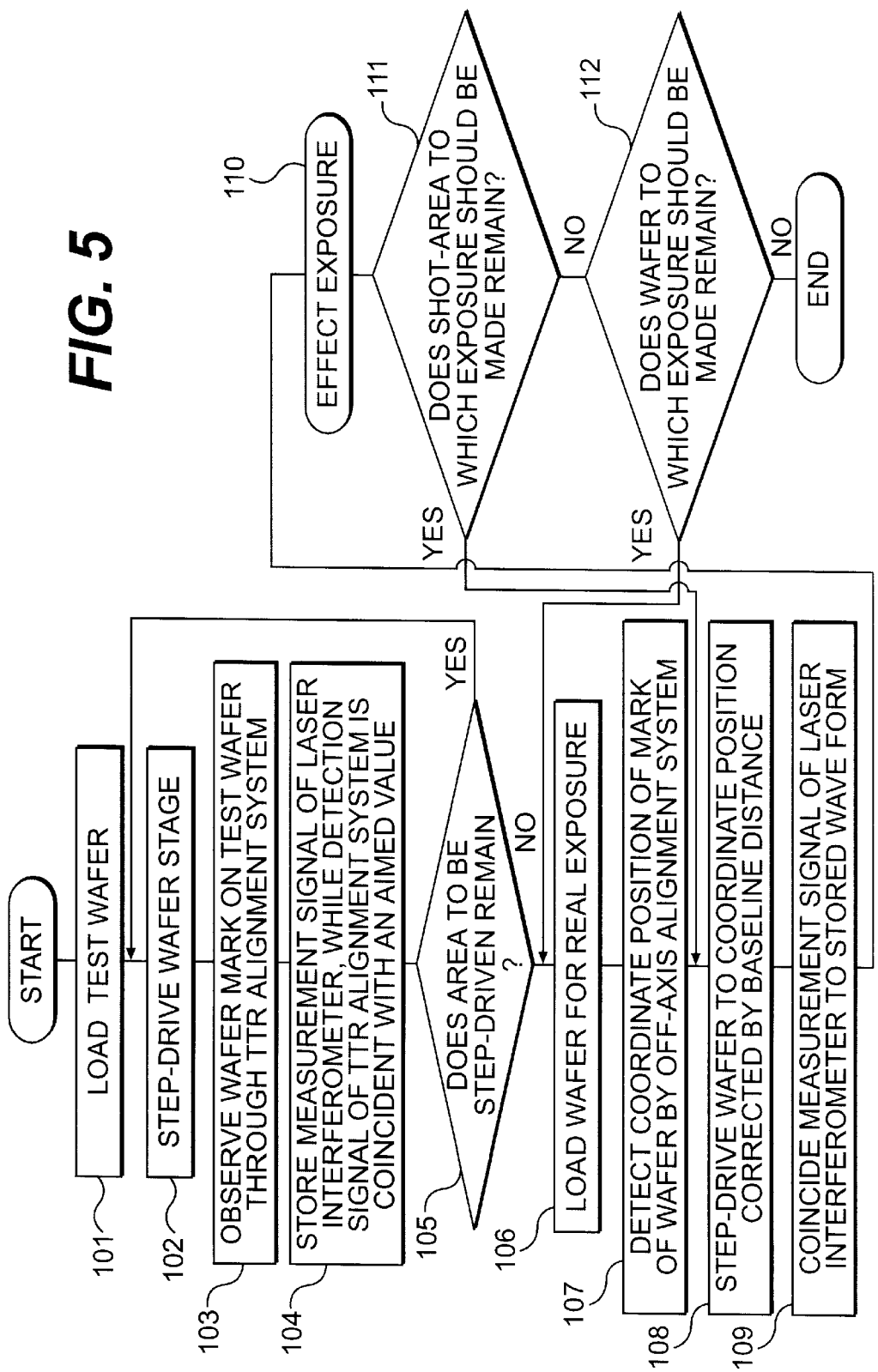
FIG. 5 is a flow chart showing an exposure operation of the invention.
Figure 6:
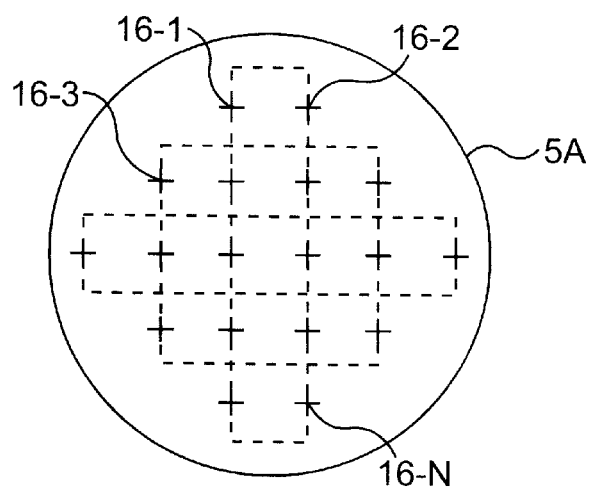
FIG. 6 is a plan view showing a test wafer that can be used to align and calibrate the substrate positioning stage to the projection unit.

Once the system has processed the test wafer, the system processes production wafer 5 as specified in FIG. 5, steps 106–112. Wafer stage 6 is step-driven, and the positions (X- and Y-coordinates) of two or more alignment marks near a plurality of shot areas on the wafer 5 are detected by the off-axis alignment system 15, thereby obtaining the shot arrangement of the exposure target areas on wafer 5.

The coordinates (the measurement results obtained by the laser interferometers 9X and 9Y) of the alignment marks on the wafer 5 are obtained, and a coordinate conversion formula for converting the sample coordinate system on the wafer 5 into the apparatus coordinate system is obtained from the coordinates by a statistical process. The details of such a global alignment scheme are disclosed in, e.g., U.S. Pat. No. 4,780,617, which is incorporated by reference in its entirety herein.

In step 108, the wafer stage 6 is step-driven to aimed-position coordinates obtained by correcting the coordinates on the apparatus coordinate system, obtained by step 107, by the base line amount, in the shot order obtained when the test wafer was step-driven. With this operation, the respective shot areas as aimed exposure areas of the wafer 5 are sequentially moved into the exposure field of the projection unit 4.

In step 109, the main control system 12 drives the wafer stage 6 so as to reproduce the waveforms of the measurement signals SX and SY stored in the memory 13. In addition, a pattern image in a pattern area of the reticle 1 is projected/exposed on the shot area on the wafer 5 while the waveforms read from memory 13 coincides with the waveforms of the actually output measurement signals SX and SY (step 110). If shot areas remain to be exposed, the wafer is stepped to the next shot area to be exposed, the vibrations of the wafer stage 6 are reproduced, and exposure is effected. In this manner, pattern images of the reticle 1 are exposed on all the shot areas as aimed exposure areas on the wafer 5.

Certain preferred embodiments have been discussed, and other embodiments are readily apparent to those of ordinary skill in the art from the narrative herein. Consequently, the following patent claims are not limited to the preferred embodiments described above but are to be given the broadest reasonable interpretation that is consistent with the principles of the invention as discussed herein.

What is claimed is:

1. An optical apparatus, comprising:
   a reference structure comprising a material having a low coefficient of thermal expansion;
   a plurality of reference features associated with the reference structure, the plurality of reference features comprising a first reference mirror and a second reference mirror; and
   a plurality of expansion joints associated with the reference structure, wherein the expansion joints are adapted to engage a projection unit so as to maintain the first reference mirror and the second reference mirror in fixed relationship to an optical axis of the projection unit.

2. The optical apparatus of claim 1, wherein the second reference mirror is oriented approximately 90 degrees from the first reference mirror.

3. The optical apparatus of claim 1, wherein the plurality of reference features further comprises an off-axis alignment system.

4. The optical apparatus of claim 1, wherein each expansion joint comprises a flexure.

5. The optical apparatus of claim 1, wherein at least one of the first reference mirror and the second reference mirror comprises a polished surface of the reference structure.

6. The optical apparatus of claim 1, wherein the reference structure has a coefficient of thermal expansion less than $10^{-6}$/deg C.

7. The optical apparatus of claim 1, wherein each expansion joint flexes along one direction.

8. The optical apparatus of claim 1, further comprising:
   a stage movable along a plane perpendicular to the optical axis of the projection unit; and
   at least one interferometer measuring the position of the stage in the plane, wherein the at least one interferometer utilizes at least one of the first reference mirror and the second reference mirror.

9. The optical apparatus of claim 1, wherein the coefficient of thermal expansion of the reference structure is less than the coefficient of thermal expansion of the projection unit.

10. The optical apparatus of claim 1, wherein the reference structure comprises an inorganic, non-porous glass-ceramic material.

* * * * *